Aug. 3, 1954
E. JUSTI
2,685,608
THERMOELEMENT, PARTICULARLY FOR THE ELECTROTHERMIC PRODUCTION OF COLD
Filed Dec. 10, 1952
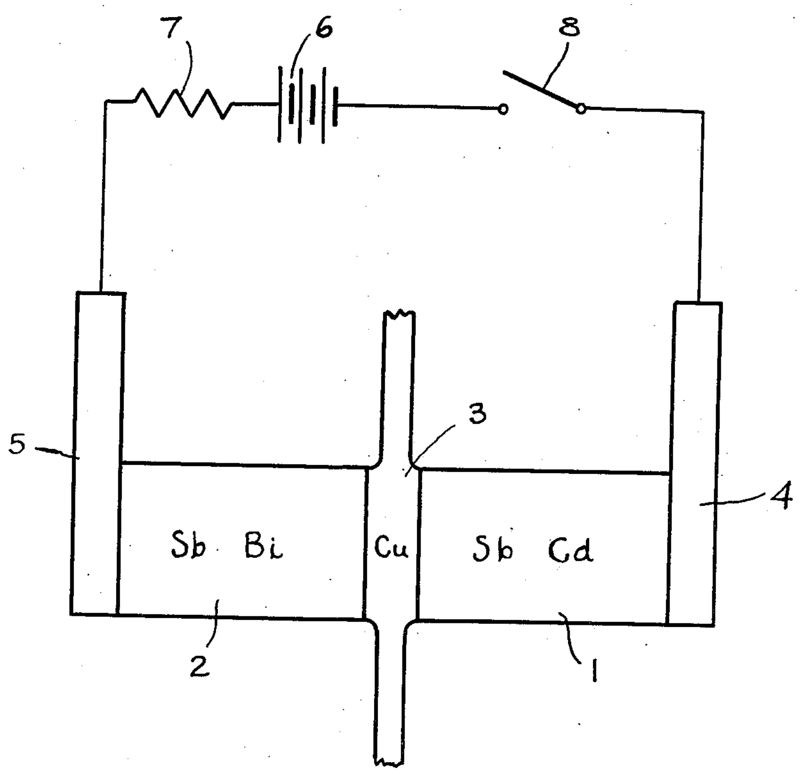
INVENTOR:
EDUARD JUSTI
BY C. M. Avery
ATTORNEY Patented Aug. 3, 1954

2,685,608

UNITED STATES PATENT OFFICE 2,685,608

THERMOELEMENT, PARTICULARLY FOR THE ELECTROTHERMIC PRODUCTION OF COLD

Eduard Justi, Braunschweig, Germany, assignor to Siemens-Schuckertwerke Aktiengesellschaft, Berlin-Siemensstadt, Germany, a German corporation Application December 10, 1952, Serial No. 325,120

Claims priority, application Germany November 2, 1951

8 Claims. (Cl. 136—4)

This is a continuation-in-part of my copending applictaion Serial No. 318,271, filed November 1, 1952, under the same title and assigned to the assignee of the present invention, which application has since become abandoned as of January 18, 1954.

My invention relates to thermoelectric elements comprising a single or multiple junction of different metals. Such elements, used as part of an electric circuit, generate an electric current when the junction has a temperature different from the rest of the circuit, or they generate heat or cold at the junction when a current of one or the opposite direction is passed through the circuit.

It is an object of my invention to provide thermoelectric elements of larger thermoelectric power than heretofore attained with such devices. Another object of my invention is to provide thermoelements suitable for producing a much greater reduction in temperature than heretofore possible, thus raising the thermoelectric production of cold into the realm of practical utility.

The intermetallic compounds of certain binary alloy systems, such as the system bismuth-antimony, are known to have comparatively very high differential thermoelectric power values and high values of specific electric resistance. From research work concerning the junction properties of such substances, I have made the observation that the electric behavior of these binary metal compounds is very similar to that of a semiconductor, or intrinsic semiconductor. I have found that by slightly disturbing the perfection of the binary compounds, that is by either slightly departing from the stoichiometric compositon or by adding suitable impurities, the compounds are converted into defection semiconductors whose electric conductance is considerably increased over the perfect intermetal compounds without showing a correspondingly large change in differential thermoelectric power. This results in an improvement of the "effective" thermoelectric power of the material (i. e. of the thermoelectric power value related to the normal Wiedemann-Franz-Lorenz magnitude).

According to my invention, one or both of the two junction members of differential thermoelectric power, especially in a thermoelement for electrothermic cooling purposes, consists essentially of a slightly imperfect binary metal alloy of the just-mentioned semiconductor-like type. That is, the binary alloy is given a composition which nearly corresponds to the stoichiometric composition of the binary compound of the two metals but differs from perfection by small amounts or traces of conductance-increasing departures of slight influence on the thermoelectric power. These departures from the perfect compound may either consist of a small excess of one of the two metals, or they consist of an addition of transitory metal, that is one or more of the metals which, as regards electric conductance, are intermediate the semiconductors (such as silicon or germanium) and the good conductors (such as copper or silver). These transitory metals are especially those of the iron group (Fe, Co, Ni) and other metals (Pt, Ir, Os, Ru, Rh) in the eighth group of the periodic system. The amount of departures or beneficial impurities required to secure the desired result was found to be at most 2 per cent by weight of the material.

For instance, with a cadmium-antimony alloy having an antimony content between 48 and 54 per cent by weight and containing up to 2 per cent of nickel, in thermoelectric junction with a bismuth-antimony alloy, I have measured an effective thermoelectric power of 148 $\mu$v. per degree centigrade. With a negligible contact resistance at the soldered junction of the two members, this extremely high thermoelectric power permits obtaining a reduction in temperature of as much as 27° C., thus affording for the first time an electrothermic cold production suitable for practical requirements.

The drawing shows schematically a thermoelement according to the invention. The element is composed of two thermoelectrically differential members 1 and 2 which are conductively joined with each other by an intermediate good-conductive part 3 of slight or negligible thermoelectric power. Member 1 consists of a slightly imperfect antimony-cadmium compound as described in the foregoing, and member 2 consists of a bismuth-antimony alloy. Part 3 consists preferably of copper. It serves to receive the generated cold and may be shaped as a fin, vane or other structure for the cooling of the environment or of any structure or fluid with which it may be in contact. Shown are also two copper terminals 4, 5 and an energizing circuit comprising a current source 6, a resistor 7, and a control switch 8. Several thermoelements according to the invention may be combined to a pile or stack depending upon the desired output.

Additional examples of thermoelement combinations according to the invention:

1. A first member of an alloy with 52.1% Sb, 47.3% Cd and 0.6% Ni was joined with a second member consisting of an alloy with 90.0% Bi, 9.9% Sb and 0.1% Ag. The effective thermoelectric power of the element was measured as $e'=148$ millivolt per degree centigrade (μv./° C.)

2. First member: 51.6% Sb, 48.3% Cd, 0.1% Ni. Second member: 90.0% Bi, 9.9% Sb, 0.1% Ag. Effective thermoelectric power: $e'=146$ μv./° C.

3. First member: 51.5% Sb, 48.4 Cd, 0.1% Ni. Second member: 90.0% Bi, 9.9% Sb, 0.1% Ag. Effective thermoelectric power: $e'=132$ μv./° C.

4. First member: 51.5% Sb, 48.3% Cd, 0.2% Ni. Second member: 90.0% Bi, 9.9% Sb, 0.1% Ag. Effective thermoelectric power $e'=128$ μv./° C.

I claim:

1. A cold producing thermoelement, comprising two circuit members of different respective materials, a heat absorbing element having good heat conductivity and slight thermoelectric power conductively joined intermediate said members to form together therewith a thermoelectric junction, at least one of said two members consisting of a binary compound of two metals of a slightly imperfect composition departing from perfect stoichiometry by an amount of at most 2% by weight of the total material of said member and having semiconductor-like electric conductance.

2. In a thermoelement according to claim 1, said amount consisting of an excess of one of the two metals over the other.

3. In a thermoelement according to claim 1, said amount consisting of beneficial impurity substance additional to the stoichiometric composition of said binary alloy.

4. A cold producing thermoelement, comprising two circuit members of different respective materials, a heat absorbing element having good heat conductivity and slight thermoelectric power conductively joined intermediate said members to form together therewith a thermoelectric junction, at least one of said two members consisting of a binary alloy of cadmium and antimony and having an antimony content between 48 and 54% by weight.

5. A cold producing thermoelement, comprising two circuit members of different respective materials, heat absorbing element having good heat conductivity and slight thermoelectric power conductively joined intermediate said members to form together therewith a thermoelectric junction, at least one of said two members consisting of a binary compound of cadmium and antimony with an impurity addition of at most 2% by weight of metal of the transitory type, and having relative to the pure binary compound an increase in electric conductance unproportionately larger than the decrease in thermoelectric power.

6. A cold producing thermoelement, comprising two circuit members of different respective materials, heat absorbing element having good heat conductivity and slight thermoelectric power conductively joined intermediate said members to form together therewith a thermoelectric junction, at least one of said two members consisting of a binary alloy of cadmium and antimony of an antimony content between 48 and 54% by weight with an added impurity consisting of at most 2% of nickel.

7. A cold producing thermoelement, comprising two circuit members of different metallic materials, heat absorbing element having good heat conductivity and slight thermoelectric power of large differential thermoelectric power, and an intermediate part of larger conductance and of negligible differential thermoelectric power as compared with said two members, said members and said part being joined together to form a thermoelectric junction, at least one of said members consisting of a binary compound of two metals of a slightly imperfect composition departing from perfect stoichiometry by an amount of at most 2% by weight of the total material of said member and having semiconductor-like electric conductance.

8. In a thermoelement according to claim 1, said compound of one of said two members being a cadmium-antimony alloy with 48 to 54% antimony, and said other member being a bismuth-antimony alloy.

References Cited in the file of this patent

UNITED STATES PATENTS

| Number | Name | Date |
|---|---|---|
| 413,136 | Dewey | Oct. 15, 1889 |
| 1,120,781 | Altenkirch et al. | Dec. 15, 1914 |
| 1,856,865 | Darrah | May 3, 1932 |
| 2,352,056 | Wilson | June 20, 1944 |

FOREIGN PATENTS

| Number | Country | Date |
|---|---|---|
| 579,358 | France | Oct. 15, 1924 |
| 550,265 | Germany | May 14, 1932 |
| 943,712 | France | Mar. 16, 1949 |

OTHER REFERENCES

"Some Experiments with the Peltier Effect," Electrical Engineering Mag., vol. 70, No. 7, July 1951, page 589.

"The Efficiency of Thermoelectric Generators," Journal of Applied Physics, vol. 18, December 1947, pages 1116–1127.